(12) United States Patent
Toma et al.

(10) Patent No.: US 12,353,340 B2
(45) Date of Patent: Jul. 8, 2025

(54) SYSTEMS FOR HIGH-SPEED COMPUTING USING AN OPTICAL INTERCHANGE

(71) Applicant: Google LLC, Mountain View, CA (US)

(72) Inventors: Horia Alexandru Toma, Sunnyvale, CA (US); Zuowei Shen, Los Altos, CA (US); William F. Edwards, Jr., Livermore, CA (US); Gurushankar Rajamani, Sunnyvale, CA (US); Hong Liu, Palo Alto, CA (US); Ilyas Mohammed, San Jose, CA (US)

(73) Assignee: Google LLC, Mountain View, CA (US)

( * ) Notice: Subject to any disclaimer, the term of this patent is extended or adjusted under 35 U.S.C. 154(b) by 42 days.

(21) Appl. No.: 18/223,332

(22) Filed: Jul. 18, 2023

(65) Prior Publication Data

US 2025/0028661 A1    Jan. 23, 2025

(51) Int. Cl.
*G06F 13/16*      (2006.01)

(52) U.S. Cl.
CPC ................................. *G06F 13/1684* (2013.01)

(58) Field of Classification Search
CPC .................................................. G06F 13/1684
See application file for complete search history.

(56) References Cited

U.S. PATENT DOCUMENTS

| 2004/0177126 | A1* | 9/2004 | Maine | G06F 11/2087 |
| | | | | 709/217 |
| 2007/0189052 | A1* | 8/2007 | Ogawa | G11C 5/066 |
| | | | | 365/189.02 |
| 2013/0272651 | A1* | 10/2013 | Morris | G02B 6/3596 |
| | | | | 385/16 |
| 2017/0279555 | A1 | 9/2017 | Schimpe | |
| 2019/0214365 | A1 | 7/2019 | Gu et al. | |
| 2020/0145099 | A1* | 5/2020 | Ryan | H04B 10/803 |
| 2020/0284981 | A1* | 9/2020 | Harris | G02B 6/1225 |
| 2021/0257021 | A1 | 8/2021 | Meade et al. | |
| 2023/0144656 | A1* | 5/2023 | Song | G06F 12/0607 |
| | | | | 711/157 |

OTHER PUBLICATIONS

Extended European Search Report for European Patent Application No. 24189338.7 dated Nov. 18, 2024. 13 pages.

* cited by examiner

*Primary Examiner* — Henry Tsai
*Assistant Examiner* — Harry Z Wang
(74) *Attorney, Agent, or Firm* — Lerner David LLP

(57) ABSTRACT

The disclosure provides for high bandwidth processing through the sharing of memory dies over a plurality of computing dies via an optical interchange. The optical interchange may be configured so as to operate as both an optical switch and optical demultiplexer. The optical switch configuration for the optical interchange allows for data to be written from any computing die to one of a plurality of memory dies via an optical connection. The optical demultiplexer configuration allows for data to be broadcast from a memory die to a plurality of the computing dies.

20 Claims, 3 Drawing Sheets

SYSTEMS FOR HIGH-SPEED COMPUTING USING AN OPTICAL INTERCHANGE

BACKGROUND

High-speed computing can be performed using computing packages that have a plurality of high bandwidth memory ("HBM") and a plurality of computing dies. However, it is becoming increasingly difficult to fit additional memory and computing dies onto packages in a manner that allows for efficient transmission of data using electrical transmissions. In addition, known systems of optical transmission provide for inefficient utilization of memory and computing dies.

BRIEF SUMMARY

The present application relates to systems for providing high bandwidth connections between memory and computing units. Aspects of the disclosure allow for the high-speed memory and computing units to be disaggregated while maintaining a high bandwidth at relatively low power and cost. Communication between the memory and computing units is achieved via an optical interchange that allows for optical signals to be transmitted between the memory and computing units in an efficient manner. The optical interchange may be configured so that any computing unit may write data to any memory unit. In addition, the optical interchange may be configured so that a memory unit can simultaneously broadcast data to a plurality of computing units.

In accordance with aspects of the disclosure, a system for computing and memory communication may include: a plurality of high-bandwidth memory units (HBMs), wherein each HBM has a memory optical interface; a plurality of computing units, wherein each of the computing units has a computing optical interface; and an optical cable that is optically connected to the memory optical interfaces of the plurality of HBMs and to the computing optical interfaces of the plurality of computing units, wherein the optical I/O includes a demultiplexer configured to transmit a read-related signal received from any one of the plurality of HBMs to one or more of the computing units from the plurality of computing units, and wherein the optical interchange includes a switch configured to transmit a write-related signal received from any one of the plurality of computing units to any one of the plurality of HBMs.

In accordance with other aspects of the disclosure, the memory optical interfaces of the plurality of HBMs may further include a first memory optical interface configured to send read-related signals and a second memory optical interface configured to receive write-related signals. The computing optical interface of the plurality of computing units may further include a first computing optical interface configured to receive read-related signals and a second computing optical interface configured to send write-related signals.

In accordance with still other aspects of the disclosure, the demultiplexer of the optical interchange may further include an input optical interface for each of the plurality of HBMs and an output optical interface for each of the computing units. The demultiplexer may be further configured to simultaneously transmit the read-related signal to more than one computing unit. The demultiplexer may be further configured to transmit the read-related signal while the switch transmits the write-related signal.

In accordance with other aspects of the disclosure, the plurality of HBMs may include active HBMs and at least one spare HBM, and wherein the switch is configured to transmit write-related signals to only active HBMs.

In accordance with yet other aspects of the disclosure, plurality of HBMs may be located on a first substrate and the plurality of computing units may be located on a second substrate. In addition, the first substrate may be located on a first device and the second substrate may be located on a second device.

In accordance with still other aspects of the disclosure, the memory optical interfaces and the computing optical interfaces may be electrically connected via one or more interposers.

In accordance with other aspects of the disclosure, a system for computing and memory communication may include: a first package having a plurality of high-bandwidth memory units (HBMs); a second package having a plurality of computing units; and an optical interchange that is configured to optically connect the HBMs and the computing units, wherein the optical interchange includes a demultiplexer configured to provide a read-related signal from any one of the plurality of HBMs to any set of computing units from the plurality of computing units, and wherein the optical interchange includes a switch configured to provide a write-related signal from any one of the plurality of computing units to any one of the plurality of HBMs.

In accordance with other aspects of the disclosure, each of the plurality of HBMs may further include a first memory optical interface configured to send read-related signals and a second memory optical interface configured to receive write-related signals.

In accordance with still other aspects of the disclosure, the plurality of computing units may further include a first computing optical interface configured to receive read-related signals and a second computing optical interface configured to send write-related signals.

In accordance with yet other aspects of the disclosure, the demultiplexer of the optical interchange may further include an input optical interface for each of the plurality of HBMs and an output optical interface for each of the computing units. In addition, the demultiplexer may be further configured to simultaneously transmit the read-related signal to a plurality of computing units.

In accordance with aspects of the disclosure, the optical interchange may further include an optical chiplet optically connected to a plurality of optical fibers, and wherein each of the computing units are optically connected to one or more of the plurality of optical fibers that are interconnected with an optical interface for computing units.

In accordance with other aspects of the disclosure, the plurality of HBMs may include active HBMs and at least one spare HBM, and wherein the switch is configured to transmit write-related signals to active HBMs. In accordance with other aspects of the disclosure the plurality of HBMs may be configured as part of a 3D memory stack.

In accordance with still other aspects of the disclosure the first package may be located on a first device and the second package is located on a second device. In addition, the optical interchange may be positioned on the first package or on the second package.

DETAILED DESCRIPTION

The technology relates to high bandwidth processing using optical connections between memory and computing units. In particular, the present disclosure provides for a system of high-speed communication between high-performance computing units, such as tensor processing units (TPUs) or other application-specific integrated circuits (ASICs), and high-performance memory units, such as high-bandwidth memory units (HBMs). The systems disclosed herein can be implemented in connection with particular high-performance computing applications, including using the system in machine learning accelerators, supercomputer systems, and in cloud-computing applications.

In accordance with the disclosure, a plurality of computing units can be optically interconnected with a plurality of the memory units in a manner that allows for efficient high-bandwidth data transfer. These optical connections can be controlled by an optical interchange that is configured to allow any of the computing units to optically transmit data from any of the computing units to any of the memory units. In addition, the optical interchange can be configured so that data stored at any particular memory unit can be simultaneously broadcast to a plurality of computing units. By using the disclosed optical interchange in connection with a plurality of low-latency, high-bandwidth optical connections, the memory from a plurality of memory units can be efficiently shared across a plurality of computing in a manner that allows for increased bandwidth, while also limiting the associated power and cost of operation.

Figure 1:
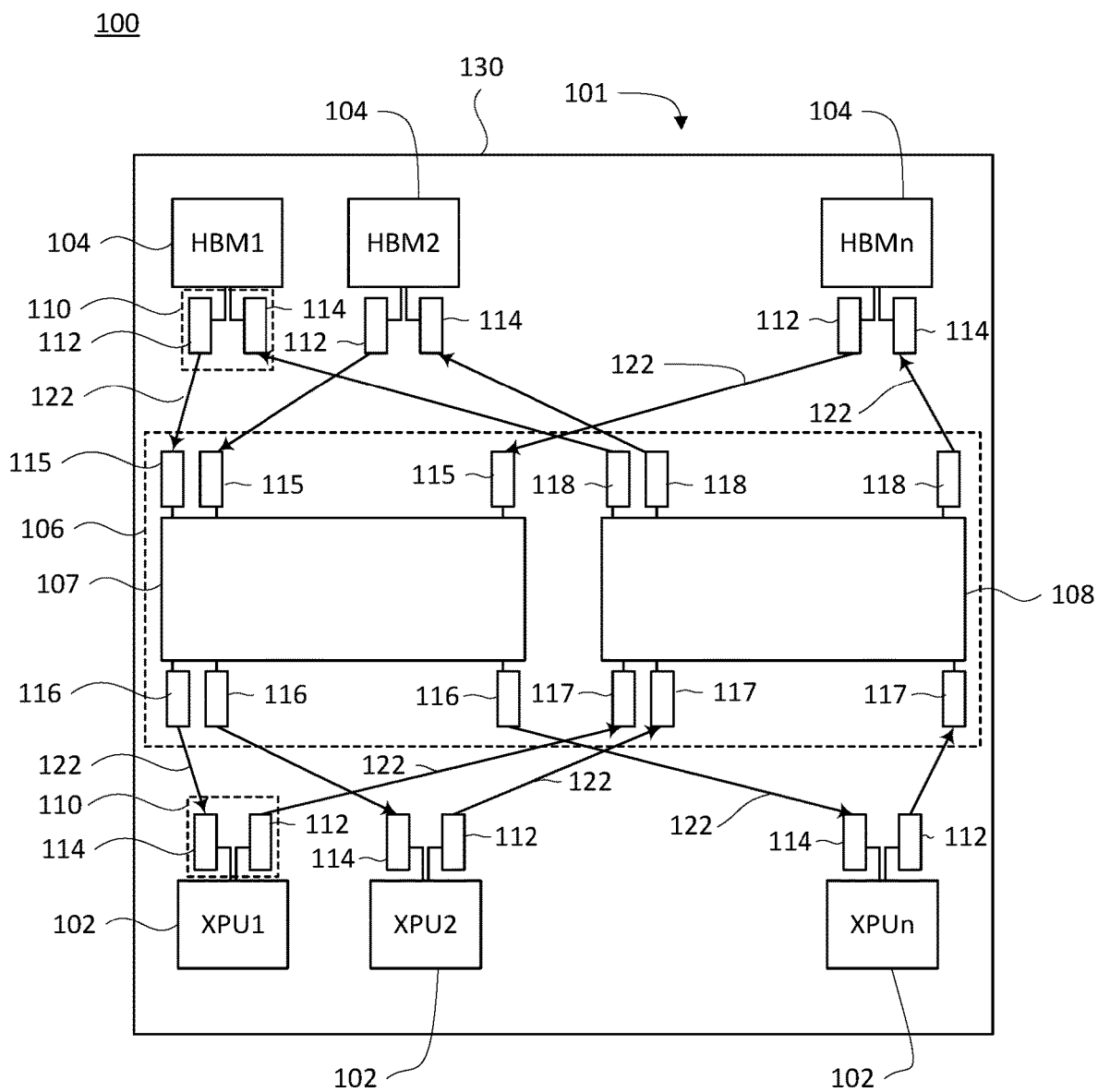
FIG. 1 is a block diagram of a computing package having an optical interchange in accordance with aspects of the disclosure.

FIG. 1 is a block diagram 100 that provides an example system 101 in accordance with the disclosure. The system includes a plurality of computing dies (XPUs) 102 and a plurality of HBM dies 104. Each computing die 102 and each HBM die 104 may be electrically connected to an optical interface 110, which can include an optical output 112 and an optical input 114. The optical outputs 112 and optical inputs 114 are connected to optical fibers 122, which are configured to transmit optical signals over the length of the optical fiber 122.

System 101 also includes an optical interchange 106. Optical interchange 106 is configured to send and receive optical signals between computing dies 102 and HBM dies 104. The optical signals transmitted between the computing dies 102 and HBM dies 104 may be divided into "write-related" transmissions and "read-related" transmissions. The write-related transmissions include the signal transmissions that are related to the process of data being written to an HBM die 104. The read-related transmissions include the signal transmissions that are related to the process of data being read from an HBM die 104. Optical interchange 106 is configured to include a write switch 108 and a read demultiplexer 106. The write switch 108 is configured for directing a write-related transmission from a computing die 102 to a HBM die 104, while the read demultiplexer 106 is configured to broadcast data from an HBM die 104 to a plurality of computing dies 102.

Accordingly, optical interchange 106 is configured to receive a write-related signal transmission from any one of the computing dies 102 and to transmit the write-related signal transmission to any one of the HMB dies 104. For example, the XPU1 computer die 102 may have a set of data that is to be written to one of the HBM dies 104. This set of data can be optically transmitted by the optical interface 110 of the XPU1 computer die 102 via an optical output 112 and along an optical fiber 122. This optical signal is received by optical interchange 106 via a write optical input 117, which is electrically connected to write switch 108. Upon receiving the optical signal at write optical input 117, write switch 108 is configured to selectively switch the transmission of the received signal to one of the HBM dies 104. For example, the received signal can contain an address or other identifier that indicates the data within the received signal is to be stored at a particular HBM die 104, for example HBM2. Write switch 108 may be configured to identify a write optical output 118 that corresponds to the identified HBM die 104 and to transmit a write-related signal transmission via the identified optical output 118. An optical transmission can then proceed from the identified optical output 118 along an optical fiber 122 to the optical input 114 of the identified HBM die 104. The HBM die 104 may then write data contained within the received transmission into its memory in accordance with the write-related signal transmission. Similarly, a write-related signal transmission from another computing die 102, such as XPU2, may be directed by write switch 108 to any one of the HBM dies 104.

In addition, optical interchange 106 is configured to allow for the broadcast of data from an HBM die 104 to a plurality of computing dies 102. For example, an HBM die 104, such as HBM1, may read data from its memory and transmit the read data via an optical output 112. The data is transmitted as an optical signal via optical fiber 122 as a read-related transmission to a read optical input 115. As shown in block diagram 100, each read optical input 115 is electrically connected to read demultiplexer 107. Upon receiving the optical signal at read optical input 115, read demultiplexer 107 is configured to selectively transmit the received optical signal to one or more of the computing dies 102. For example, a read-related transmission received at read optical input 115 can designate one or more computing dies 102 that are to receive the read-related transmission. Read demultiplexer can be configured to identify the read optical outputs 116 that correspond to the designated computing dies 102. The read-related transmission is transmitted via the identified read optical outputs 116 and corresponding optical fibers 122 to each of the identified computing dies 102. Each of the identified computing dies 102 may then access and process data from the read-related transmission via the optical inputs 114.

The read-related transmission from demultiplexer 107 may occur simultaneously along multiple read optical outputs 116. By allowing for a read-related transmission from a particular HBM die 104 to be broadcast to a plurality of computing dies 102, along with access to any HBM die 104 by any computing die 102, system 101 allows for increased bandwidth and capacity of memory by an order of magnitude. The implementation of system 101 also avoids replication of data and data transfers. Thus, system 101 reduces the total cost of ownership while increasing the overall performance of the computing dies 102 and HBM dies 104. In addition, optical interchange 106 may be configured so that the optical fibers 122 are connected to an optical chiplet that is configured to send and receive optical communications over a plurality of optical fibers.

A read request may be made by a computing die 102 by transmitting the read request to an HBM die 104 via optical interchange 106. This read request from computing die 102 may be transmitted via optical output 112 of the computing die 102 and may be transmitted via write switch 108 to the appropriate HBM die 104. Alternatively, an HBM die 104 may receive a read request from another device, including other HBM dies 114 that are electrically connected to one another.

The number of computing dies 102 and HBM dies 104 within system 101 can be based on the desired parameters of the application and hardware of the system. Within block diagram 100, the computing dies 102 are numbered from XPU1 to XPUn. Similarly, HBM dies 104 are numbered from HBM1 to HBMn. However, this does not mean that there are necessarily the same number of computing dies 102 and HBM dies 104. In addition, the configuration of the HBM dies 104 and computing dies 102 may vary. For example, at least a portion of the HBM dies 104 may be included in a 3D stack of HBM dies 104, in which signals are transmitted within the stack by through-silicon vias (TSVs).

In accordance with aspects of the disclosure, system 101 may include one or more spare HBM dies 104. A spare memory die is one that is not currently in an active state, so that it will not perform read or write operations for the system. For example, a memory die 104 may be designated as a spare die and be kept in a dormant state, or an otherwise low-power state, so that the memory die 104 is not drawing any or as much power as an active memory die 104. In addition, system 101 can be configured so that memory die 104 is designated as a spare die, so that it will not perform particular system operations, such as those related to read or write requests from computing dies 102.

Accordingly, optical interchange 106 may identify one or more memory dies 104 as spare memory dies, and will not direct read or write transmission to the memory dies that are designated as spare memory dies. However, memory dies 104 can have their designations changed, so that a spare memory die can become an active die, or an active die can be brought into a dormant state and designated as a spare memory die. For example, if the HBM1 memory die 104 is an active die that is determined to be experiencing a fault or is in need of diagnostic testing, that active HBM1 memory die 104 can be placed into a dormant state and designated as a spare memory die. Once the HBM1 memory die 104 has been designated as a spare, optical interchange 106 will not transmit read or write requests to the HBM1 memory die 104.

In addition, the formerly-active HBM1 memory die 104 can be replaced by another memory die 104 that is currently designated as a spare. For example, HBM2 memory die 104 may be currently designated as a spare die, but it can be brought out of the dormant state and designated as an active memory die 104. Upon being designated as an active memory die, computing dies 102 and optical interchange 106 may be configured to send read and write requests to the HBM2 memory die 104. Accordingly, system 101 can be configured to maintain a level of operation, even in circumstances in which one or more memory dies 104 experience a fault or are at least temporarily removed from the collection of active memory dies 104.

As shown in FIG. 1, the components of system 101 may be placed onto a single silicon substrate 130. For example, the computing dies 102, HBM dies 104, write switch 108, and read demultiplexer 107 can each be placed onto silicon substrate 130 along with corresponding chiplets for the optical inputs and optical outputs.

Figure 2:
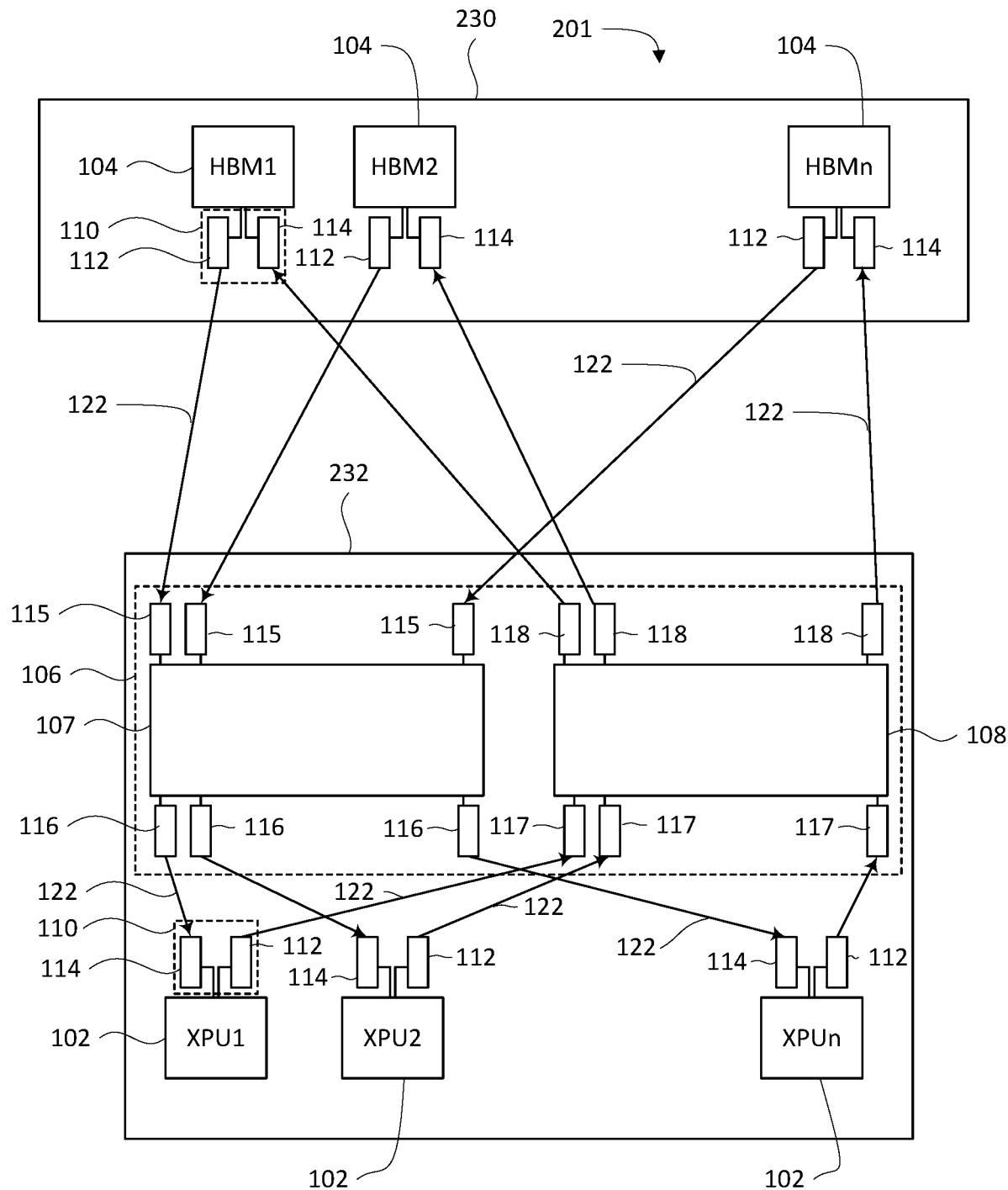
FIG. 2 is a block diagram of two computing packages having an optical interchange in accordance with aspects of the disclosure.

However, in accordance with aspects of the disclosure, the disclosed system may be configured so that the computing dies 102 and HBM dies 104 reside on different substrates and may be a part of different packages. For example, FIG. 2 is a block diagram 200 of system 201 in which the plurality of HBM dies 104 reside on a first substrate 230, while computing dies 102 and optical interchange 106 reside on a second substrate 232. The substrates 230 and 232 can be a part of separate packages within the same device, and these separate packages may reside in different devices. For example, substrate 230 may be a part of a package within a first device that is located in a first server rack, while substrate 232 may be a part of a package that is in a second device that is located in a second server rack.

In addition, the optical fibers 122 can be of a length sufficient to extend between two different devices, including, for example, devices located around 10 meters apart from one another on different racks of servers. While block diagram 200 shows individual optical fibers 122 connecting HBM dies 104 with optical interchange 106, these optical fibers 122 may be bundled, so that they provide a bundled optical connection between the HBM dies 104 and the optical interchange 106. Similarly, a bundled optical connection may exist to connect optical interchange 106 with the computing dies 102.

Although system 201 can be configured so that HBM dies 104 reside in a different package or a different device than computing dies 102, system 201 can be configured to operate in the manner described above for system 101. Accordingly, optical interchange 106 of system 201 can selectively transmit a write-related transmission from any computing die 102 to any HBM die 104 via write switch 108, and optical interchange 106 can also selectively transmit a read-related transmission from any HBM die 104 to one or more computing dies 102 via read demultiplexer 107.

Figure 3:
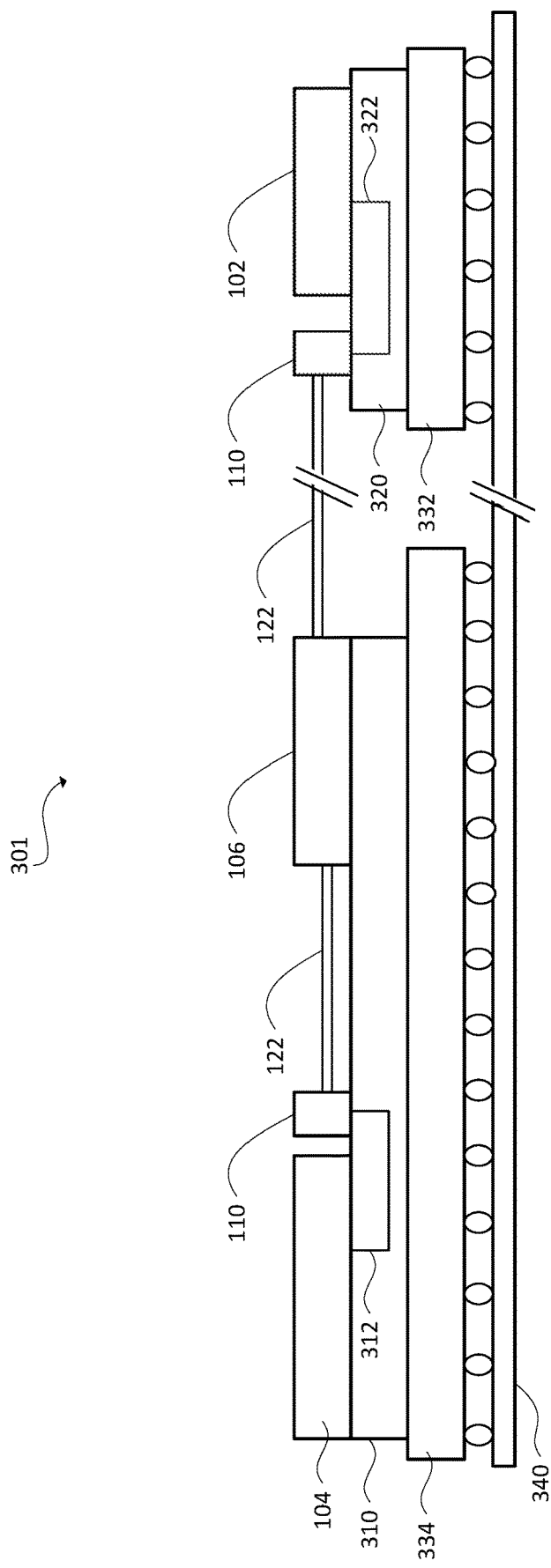
FIG. 3 is a diagram of a partial side view of two computing packages having an optical interchange in accordance with aspects of the disclosure.

FIG. 3 is a block diagram 300 of a cross-sectional side view of system 301 in which computing die 102 and HBM die 104 are located on different packages. In particular computing die 102 is located on a first substrate 332 of a first package and HBM die 104 is located on a second substrate 334 of a second package. While only one computing die 102 and one HBM die 104 are shown in block diagram 300, each substrate 332 and 334 can contain, respectively, a plurality of computing dies 102 and a plurality of HBM dies 104 in the manner described in connection with FIG. 2. As shown in block diagram 300, HBM die 104, optical interface 110, and optical interchange 106 reside on an interposer 310 that is connected to substrate 334. An electrical connection 312 is established between HBM die 104 and optical interface 110 via interposer 310. For each HBM die 104 an optical connection can be established between an optical interface 110 of HBM die 104 and the optical interchange 106. Similarly, an optical connection can be established between optical interchange 106 and an optical interface 110 of each computing die 102.

As shown in block diagram 300, optical fibers 122 can span from the optical interchange 106 of the first package substrate 334 to the optical interface 110 of the second package substrate 332. An electrical connection 322 can be established between an optical interface 110 and computing die 102 via interposer 320. Although not shown, optical interchange 106 can include a write switch and a read demultiplexer, as described herein. Thus, optical interchange 106 of system 301 can selectively transmit a write-related transmission from any computing die 102 to any HBM die 104 via a write switch, and optical interchange 106 can also selectively transmit a read-related transmission from any HBM die 104 to one or more computing dies 102 via a read demultiplexer.

The invention claimed is:

1. A system for computing and memory communication comprising:
   a plurality of high-bandwidth memory units (HBMs), wherein each HBM has a memory optical interface;
   a plurality of computing units, wherein each of the computing units has a computing optical interface; and
   an optical interchange that is optically connected to the memory optical interfaces of the plurality of HBMs and to the computing optical interfaces of the plurality of computing units, wherein the optical interchange includes a demultiplexer configured to transmit a read-related signal received from any one of the plurality of HBMs to one or more of the computing units from the plurality of computing units, and wherein the optical interchange includes a switch configured to transmit a write-related signal received from any one of the plurality of computing units to any one of the plurality of HBMs.

2. The system of claim 1, wherein the memory optical interfaces of the plurality of HBMs further comprises a first memory optical interface configured to send read-related signals and a second memory optical interface configured to receive write-related signals.

3. The system of claim 1, wherein the computing optical interface of the plurality of computing units further comprises a first computing optical interface configured to receive read-related signals and a second computing optical interface configured to send write-related signals.

4. The system of claim 1, wherein the demultiplexer of the optical interchange further comprises an input optical interface for each of the plurality of HBMs and an output optical interface for each of the computing units.

5. The system of claim 1, wherein the demultiplexer is further configured to simultaneously transmit the read-related signal to more than one computing unit from the plurality of computing units.

6. The system of claim 1, wherein the demultiplexer is further configured to transmit the read-related signal while the switch transmits the write-related signal.

7. The system of claim 1, wherein the plurality of HBMs includes active HBMs and at least one spare HBM, and wherein the switch is configured to transmit write-related signals to only active HBMs.

8. The system of claim 1, wherein the plurality of HBMs are located on a first substrate and the plurality of computing units are located on a second substrate.

9. The system of claim 8, wherein the first substrate is located on a first device and the second substrate is located on a second device.

10. The system of claim 1, wherein the memory optical interfaces and the computing optical interfaces are electrically connected via one or more interposers.

11. A system for computing and memory communication comprising:
    a first package having a plurality of high-bandwidth memory units (HBMs);
    a second package having a plurality of computing units; and
    an optical interchange that is configured to optically connect the HBMs and the computing units, wherein the optical interchange includes a demultiplexer configured to provide a read-related signal from any one of the plurality of HBMs to any set of computing units from the plurality of computing units, and wherein the optical interchange includes a switch configured to provide a write-related signal from any one of the plurality of computing units to any one of the plurality of HBMs.

12. The system of claim 11, wherein each of the plurality of HBMs further comprises a first memory optical interface configured to send read-related signals and a second memory optical interface configured to receive write-related signals.

13. The system of claim 11, wherein each of the plurality of computing units further comprises a first computing optical interface configured to receive read-related signals and a second computing optical interface configured to send write-related signals.

14. The system of claim 11, wherein the demultiplexer of the optical interchange further comprises an input optical interface for each of the plurality of HBMs and an output optical interface for each of the computing units.

15. The system of claim 11, wherein the demultiplexer is further configured to simultaneously transmit the read-related signal to more than one computing unit from the plurality of computing units.

16. The system of claim 11, wherein the optical interchange further comprises an optical chiplet optically connected to a plurality of optical fibers, and wherein each of the computing units are optically connected to one or more of the plurality of optical fibers.

17. The system of claim 11, wherein the plurality of HBMs includes active HBMs and at least one spare HBM, and wherein the switch is configured to transmit write-related signals to only active HBMs.

18. The system of claim 11, wherein the plurality of HBMs are configured as part of a 3D memory stack.

19. The system of claim 18, wherein the first package is located on a first device and the second package is located on a second device.

20. The system of claim 11, wherein the optical interchange is positioned on the first package.

* * * * *